(12) United States Patent  
Kagawa et al.

(10) Patent No.: US 7,511,964 B2  
(45) Date of Patent: Mar. 31, 2009

(54) HIGH-PERFORMANCE, SMALL AND INEXPENSIVE DIGITAL BROADCAST TUNER AND DIGITAL BROADCAST RECEIVER HAVING THE SAME

(75) Inventors: Hisanori Kagawa, Fukushima-ken (JP); Tadaomi Yamano, Fukushima-ken (JP); Yutaka Momma, Fukushima-ken (JP)

(73) Assignee: ALPS Electric Co., Ltd. (JP)

( * ) Notice: Subject to any disclaimer, the term of this patent is extended or adjusted under 35 U.S.C. 154(b) by 224 days.

(21) Appl. No.: 11/714,661

(22) Filed: Mar. 5, 2007

(65) Prior Publication Data

US 2007/0229322 A1   Oct. 4, 2007

(30) Foreign Application Priority Data

Mar. 29, 2006 (JP) .............................. 2006-091159

(51) Int. Cl.  
*H05K 5/00* (2006.01)

(52) U.S. Cl. .......................... 361/752; 361/760; 341/50

(58) Field of Classification Search ................. 361/752, 361/760; 341/50  
See application file for complete search history.

(56) References Cited

U.S. PATENT DOCUMENTS

| | | | | |
|---|---|---|---|---|
| 5,475,876 A | * | 12/1995 | Terada et al. ............. | 455/301 |
| 5,710,999 A | * | 1/1998 | Iwase et al. ............... | 455/349 |
| 6,947,722 B2 | * | 9/2005 | Kim et al. ................. | 455/349 |
| 2005/0266812 A1 | * | 12/2005 | Kim et al. ................. | 455/169.1 |

FOREIGN PATENT DOCUMENTS

JP   2005-85863   3/2005

* cited by examiner

*Primary Examiner*—Dean A. Reichard  
*Assistant Examiner*—Yuriy Semenenko  
(74) *Attorney, Agent, or Firm*—Beyer Law Group LLP

(57) ABSTRACT

A digital broadcast tuner includes a circuit board and a plurality of terminals. The circuit board has long sides and short sides. The terminals are arranged along one of the short sides of the circuit board. This reduces the length of the long sides of the circuit board and makes it smaller and more inexpensive, while reducing the length of the connection lines between a digital signal decoder circuit and the terminals, thus realizing high performance.

5 Claims, 3 Drawing Sheets

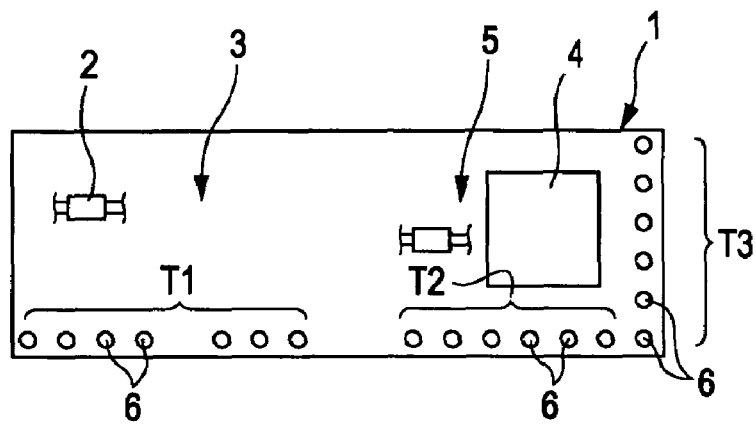
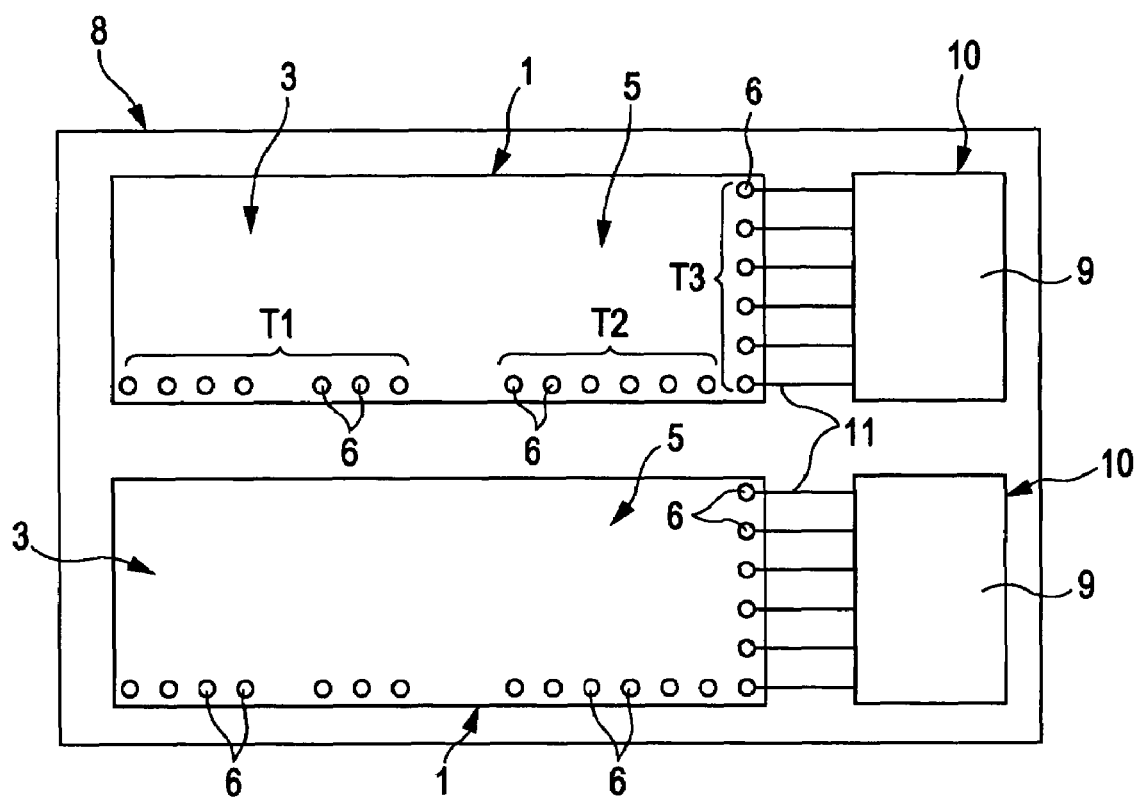

HIGH-PERFORMANCE, SMALL AND INEXPENSIVE DIGITAL BROADCAST TUNER AND DIGITAL BROADCAST RECEIVER HAVING THE SAME

BACKGROUND OF THE INVENTION

1. Field of the Invention

The present invention relates to a digital broadcast tuner and a digital broadcast receiver having the same, which are suitable for a digital television.

2. Description of the Related Art

FIG. 5 is a perspective view showing a known electronic circuit unit from which a portion has been cut out. FIG. 6 is a schematic plan view of a known digital broadcast receiver having digital broadcast tuners. The structure of the known electronic circuit unit will now be described with reference to FIG. 5. A rectangular circuit board 52 that has long sides and short sides is mounted within a square frame member 51 made of plate metal.

Various electronic components 53 are mounted on the circuit board 52 to form a desired electrical circuit. A plurality of terminals 54 are arranged in a line in proximity to one long side of the circuit board 52. The electrical circuit is connected to these terminals 54 to form a known electronic circuit unit. This arrangement is, for example, disclosed in Japanese Unexamined Patent Application Publication No. 2005-85863.

The known digital broadcast tuner that employs the above-described structure of the electronic circuit unit is shown in FIG. 6. An analog tuner circuit 55 and a digital signal decoder circuit 56 are formed on the circuit board 52. Pluralities of terminals 54 are arranged in proximity to one of the long sides of the circuit board 52 and consist of a first terminal group G1 that is electrically connected to the tuner circuit 55 and a second terminal group G2 that is electrically connected to the digital signal decoder circuit 56. Thus, the known digital broadcast tuner is formed.

The structure of a known broadcast receiver that employs the known digital broadcast tuner will now be described with reference to FIG. 6. A plurality of digital broadcast tuners are mounted on a motherboard 57 so that the long sides of the individual circuit boards 52 are opposed to each other and located a large distance from each other.

In addition, a plurality of MPEG signal decoder circuits 58 that are in a one-to-one correspondence with the respective digital broadcast tuners are formed on the motherboard 57. Each of the MPEG signal decoder circuits 58 is formed offset from one of the short sides of the circuit board 52 and near the second terminal group G2. The MPEG signal decoder circuit 58 and a portion of the second terminal group G2 are electrically connected through wiring lines 59. Thus, the known digital broadcast receiver is formed.

The known digital broadcast tuner, however, is disadvantageous in that pluralities of the terminals 54 are arranged in a line in proximity to the one of the long sides of the circuit board 52 and, therefore, the circuit board 52 becomes significantly long thereby becoming large and causing higher material cost.

Furthermore, the known digital broadcast receiver is disadvantageous in that each of the MPEG signal decoder circuits 58 is formed offset from the one of the short sides of the circuit board 52 in order to reduce the length of the connection lines with the second terminal group G2 and, therefore, the adjacent digital broadcast tuners require a large space therebetween. This makes the digital broadcast receiver large. In addition, the connection lines between the MPEG signal decoder circuit 58 and the second terminal group G2 is long, with a consequence of poor performance.

SUMMARY OF THE INVENTION

Accordingly, the present invention addresses such problems of the related art, and it is an object of the present invention to provide a high-performance, small and inexpensive digital broadcast tuner and a digital broadcast receiver having the same.

In order to achieve the above object, according to a first aspect of the present invention, a digital broadcast tuner includes a rectangular circuit board, a plurality of terminals and a cover. The circuit board has first and second long sides and first and second short sides. A tuner circuit and a digital signal decoder circuit are formed on the circuit board. A plurality of the terminals are fitted to the circuit board and electrically connected to the tuner circuit and the digital signal decoder circuit. The digital signal decoder circuit includes a digital signal decoder IC. The cover made of plate metal within which the circuit board is mounted covers the tuner circuit and the digital signal decoder circuit. Some of the terminals are arranged in proximity to the first long side of the circuit board and some of the terminals are arranged in proximity to the first short side of the circuit board. The digital signal decoder IC is arranged on the circuit board in proximity to the terminals that are arranged in proximity to the first short side. The digital signal decoder circuit is electrically connected to the terminals that are arranged in proximity to the first short side.

In accordance with the first aspect of the present invention, by means of the terminals arranged in proximity to the first short side of the circuit board, the length of the long sides of the circuit board may be markedly reduced, thus achieving a small and inexpensive digital broadcast tuner. In addition, it is possible to reduce the length of the connection lines between the digital signal decoder circuit and the terminals, which leads to a high-performance digital broadcast tuner.

In the first aspect of the present invention, some of the terminals may be arranged in a line in proximity to the first long side and some of the terminals may be arranged in proximity to the first short side. The terminals may include first and second terminal groups arranged in proximity to the first long side and a third terminal group arranged in proximity to the first short side. The tuner circuit may be electrically connected to the first terminal group. The second and third terminal groups may be located a distance from the first terminal group and in proximity to each other. The digital signal decoder circuit may be electrically connected to the second and third terminal groups.

In accordance with the above structure, the second and third terminal groups may be arranged in proximity to the digital signal decoder circuit, and it is possible to reduce the length of the connection lines between the second and third terminal groups and the digital signal decoder circuit, thus providing a high-performance digital broadcast tuner.

In the first aspect of the present invention, the terminals may have a linear shape and pass through the circuit board to project downward therethrough.

In accordance with the above structure, the terminals may be easily connected to a motherboard with a small space requirement.

In order to achieve the above object, according to a second aspect of the present invention, a digital broadcast receiver includes a digital broadcast tuner having the components as described in the first aspect of the present invention, a motherboard, and an MPEG signal decoder circuit. The digital broadcast tuner is mounted on the motherboard. The MPEG signal decoder circuit having an MPEG signal decoder IC is formed on the motherboard. The MPEG signal decoder circuit is provided on a side that is opposed to the first short side of the circuit board where the terminals are arranged and electrically connected to the terminals that are arranged in proximity to the first short side of the circuit board.

In accordance with the second aspect of the present invention, since the MPEG signal decoder circuit is formed to be opposed to the first short side of the circuit board, the motherboard has a high space factor thereby providing a small digital broadcast receiver. In addition, it is possible to reduce the length of the connection lines between the MPEG signal decoder circuit and the terminals arranged in proximity to the first short side of the circuit board, thus realizing a high-performance digital broadcast receiver.

In the second aspect of the present invention, the digital broadcast receiver may include a plurality of the digital broadcast tuners and a plurality of the MPEG signal decoder circuits that are formed on the motherboard in a one-to-one correspondence with the digital broadcast tuners. A plurality of the digital broadcast tuners may be aligned on the motherboard so that the long sides of the circuit boards are located adjacent to each other. The MPEG signal decoder circuits may be arranged to be opposed to the respective first short sides of the circuit boards. The MPEG signal decoder circuits may be electrically connected to the terminals arranged in proximity to the respective first short side of the circuit board of the digital broadcast tuner.

In accordance with the above structure, it is possible to reduce the space between the digital broadcast tuners, so that the size of the digital broadcast receiver may be small. At the same time, it is possible to reduce the length of the connection lines between each of the MPEG signal decoder circuits and the terminals that are arranged in proximity to the respective first short side of the circuit board, thus realizing a high-performance digital broadcast receiver.

BRIEF DESCRIPTION OF THE DRAWINGS

FIG. 3 is a schematic plan view of a circuit board of the digital broadcast tuner according to an embodiment of the present invention;

FIG. 4 is a schematic plan view of a digital broadcast receiver according to an embodiment of the present invention;

DESCRIPTION OF THE PREFERRED EMBODIMENTS

Figure 1:
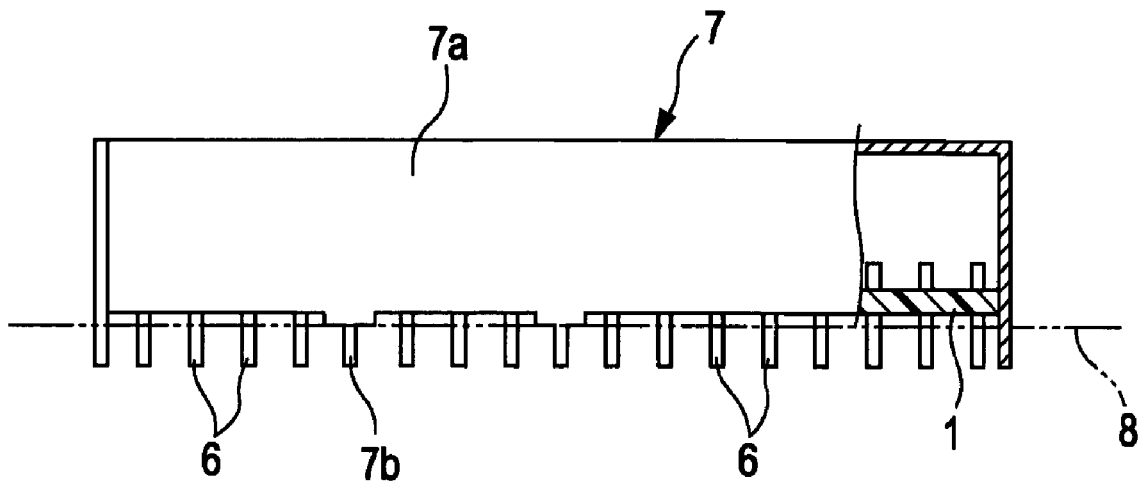
FIG. 1 is a front view of a digital broadcast tuner from which a portion has been cut out according to an embodiment of the present invention.
Figure 2:
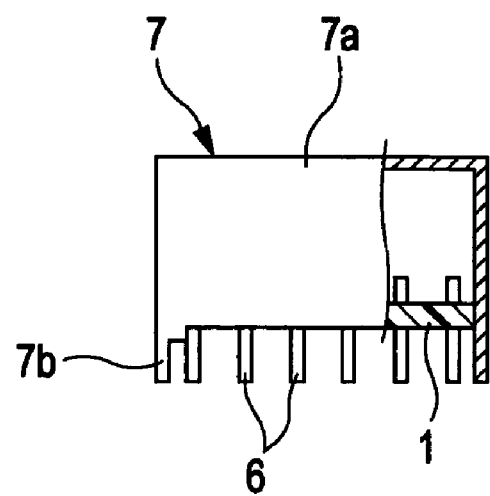
FIG. 2 is a side view of the digital broadcast tuner from which a portion has been cut out according to an embodiment of the present invention.
Figure 5:
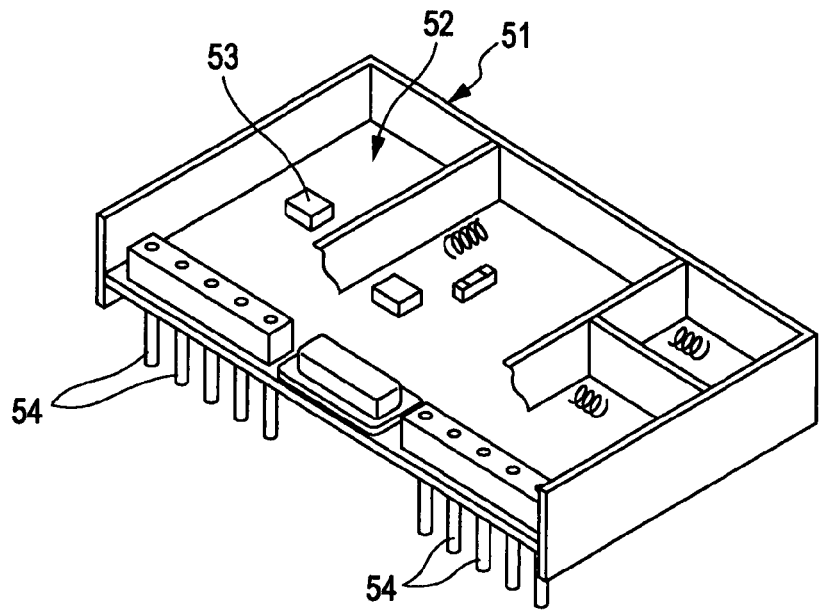
FIG. 5 is a perspective view of a known electronic circuit unit from which a portion has been cut out.
Figure 6:
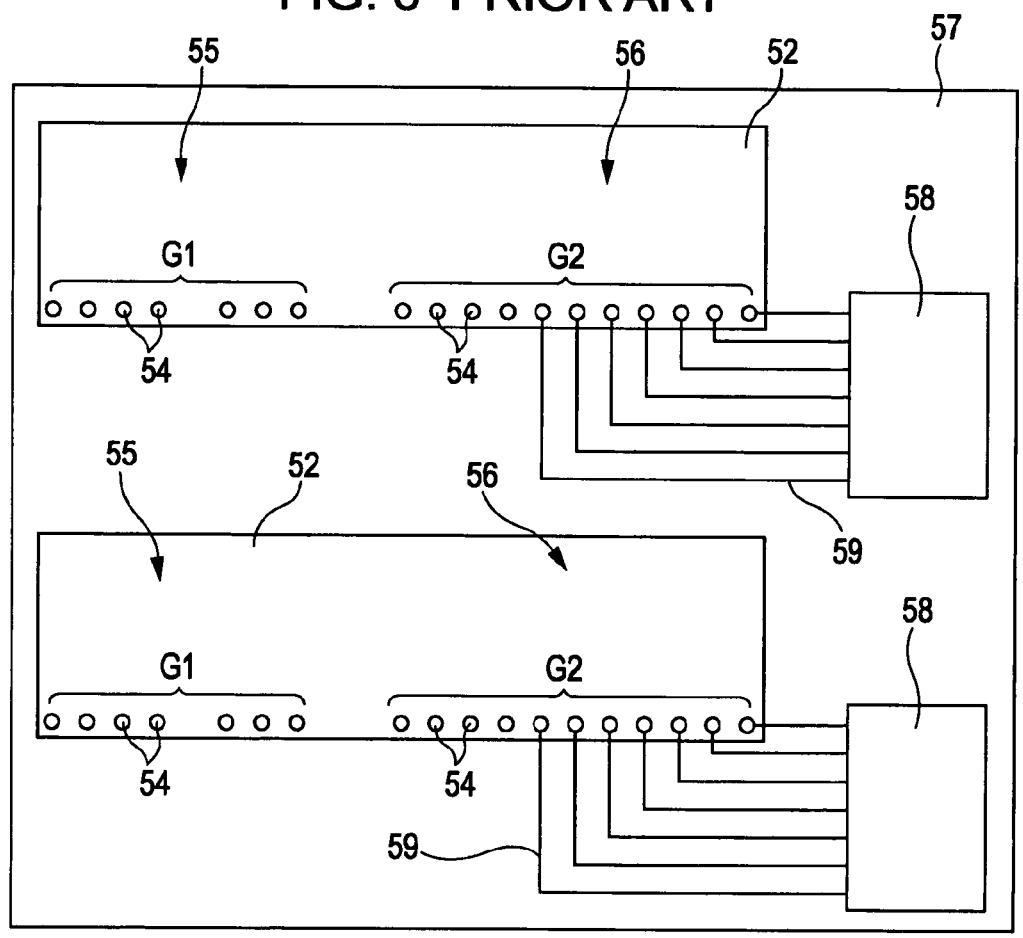
FIG. 6 is a schematic plan view of a known digital broadcast receiver having digital broadcast tuners.

An embodiment according to the present invention will be described with reference to the drawings. FIG. 1 shows a front view of a digital broadcast tuner from which a portion has been cut out according to the embodiment of the present invention. FIG. 2 shows a side view of the digital broadcast tuner from which a portion has been cut out according to the embodiment of the present invention. FIG. 3 shows a schematic plan view of a circuit board of the digital broadcast tuner according to the embodiment of the present invention. FIG. 4 shows a schematic plan view of a digital broadcast receiver according to the embodiment of the present invention.

The structure of a digital broadcast tuner according to the embodiment of the present invention will now be described with reference to FIGS. 1 through 3. A circuit board 1 is formed in a rectangular shape that has long sides and short sides. An analog tuner circuit 3 is provided on one of the short sides of the circuit board 1. The analog tuner circuit 3 includes various electronic components 2 mounted therein. A digital signal decoder circuit 5 is provided on the other of the short sides of the circuit board 1. The digital signal decoder circuit 5 includes a digital signal decoder IC 4 arranged therein.

Some of a plurality of linear terminals 6 are arranged in a line in proximity to one of the long sides of the circuit board 1 and some of the plurality of linear terminals 6 are arranged in a line in proximity to one of the short sides of the circuit board 1. The terminals 6 include a first terminal group T1 that is arranged in proximity to the long side adjacent to the tuner circuit 3 and electrically connected to the tuner circuit 3, a second terminal group T2 that is arranged in proximity to the long side adjacent to the digital signal decoder circuit 5 and electrically connected to the digital signal decoder circuit 5, and a third terminal group T3 that is arranged in proximity to the short side adjacent to the digital signal decoder circuit 5 and electrically connected to the digital signal decoder circuit 5.

The terminals 6 are electrically connected to desired circuits at the upper end thereof, while passing through the circuit board 1 to project downward therefrom.

A cover 7 made of plate metal is box-shaped and includes a box-shaped portion 7a and mounting legs 7b that extend from the lower end of the box-shaped portion 7a. The circuit board 1 is mounted and fitted within the cover 7. Thus, the digital broadcast tuner according to the embodiment of the present invention is realized.

The structure of a digital broadcast receiver according to the embodiment of the present invention will now be described with reference to FIG. 4. A plurality of the digital broadcast tuners are aligned on a motherboard 8 so that the long sides of the circuit boards 1 are arranged adjacent to each other.

It is noted that the terminals 6 and the leg portions 7b pass through the motherboard 8 and are electrically connected to a conductive pattern (not shown) formed on the motherboard 8 by means of soldering.

A plurality of MPEG signal decoder circuits 10 each including a MPEG signal decoder IC 9 are formed in a one-to-one correspondence with the respective digital broadcast tuners. Each of the MPEG signal decoder circuits 10 is provided on a side that is opposed to the short side of the circuit board 1 where the third terminal group T3 is provided. The digital signal decoder circuit 10 and the third terminal group T3 are electrically connected through connection lines 11 constituted of a conductive pattern. Thus, the digital broadcast receiver according to the embodiment of the present invention is realized.

It is noted that according to the above-described embodiment, two digital broadcast tuners are mounted in the digital broadcast receiver; however, one, three or more digital broadcast tuners may be mounted.

What is claimed is:

1. A digital broadcast tuner comprising:
 a rectangular circuit board having first and second long sides and first and second short sides, the circuit board having a tuner circuit and a digital signal decoder circuit which are formed on the circuit board;

a plurality of terminals fitted to the circuit board and electrically connected to the tuner circuit and the digital signal decoder circuit, the digital signal decoder circuit including a digital signal decoder IC; and a cover made of plate metal, within which the circuit board is mounted and which covers the tuner circuit and the digital signal decoder circuit, wherein some of the terminals are arranged in proximity to the first long side of the circuit board and some of the terminals are arranged in proximity to the first short side of the circuit board, the digital signal decoder IC is arranged on the circuit board in proximity to the terminals that are arranged in proximity to the first short side, and the digital signal decoder circuit is electrically connected to the terminals that are arranged in proximity to the first short side.

2. The digital broadcast tuner according to claim 1, wherein the terminals include first and second terminal groups that are arranged in a line in proximity to the first long side and a third terminal group that is arranged in a line in proximity to the first short side, the tuner circuit is electrically connected to the first terminal group, the second and third terminal groups are located a distance from the first terminal group and in proximity to each other, and the digital signal decoder circuit is electrically connected to the second and third terminal groups.

3. The digital broadcast tuner according to claim 1, wherein each of the terminals has a linear shape and passes through the circuit board to project downward therefrom.

4. A digital broadcast receiver comprising:

a digital broadcast tuner according to claim 1;

a motherboard on which the digital broadcast tuner is mounted; and an MPEG signal decoder circuit having an MPEG signal decoder IC, the MPEG signal decoder circuit being formed on the motherboard, wherein the MPEG signal decoder circuit is provided on a side that is opposed to the first short side of the circuit board where the terminals are arranged, and the MPEG signal decoder circuit is electrically connected to the terminals that are arranged in proximity to the first short side of the circuit board.

5. The digital broadcast receiver according to claim 4, wherein a plurality of the digital broadcast tuners are provided; and a plurality of the MPEG signal decoder circuits are formed on the motherboard in a one-to-one correspondence with the digital broadcast tuners, wherein the plurality of the digital broadcast tuners are aligned on the motherboard so that the long sides of the circuit boards are located adjacent to each other, the MPEG signal decoder circuits are arranged so as to be opposed to the respective first short sides of the circuit boards, and each of the MPEG signal decoder circuits is electrically connected to the terminals arranged in proximity to the respective first short side of the circuit board of the digital broadcast tuner.

\* \* \* \* \*